United States Patent
Choi et al.

(10) Patent No.: US 11,092,895 B2
(45) Date of Patent: Aug. 17, 2021

(54) PEELING SOLUTION COMPOSITION FOR DRY FILM RESIST

(71) Applicant: LTC CO., LTD., Hwaseong-si (KR)

(72) Inventors: Hosung Choi, Seongnam-si (KR); Kyusang Kim, Seongnam-si (KR); Jongil Bae, Anyang-si (KR); Jongsoon Lee, Suwon-si (KR); Sangku Ha, Incheon (KR); Yunmo Yang, Suwon-si (KR)

(73) Assignee: LTC Co., Ltd., Hwaseong-si (KR)

( * ) Notice: Subject to any disclaimer, the term of this patent is extended or adjusted under 35 U.S.C. 154(b) by 0 days.

(21) Appl. No.: 16/487,905

(22) PCT Filed: Apr. 16, 2019

(86) PCT No.: PCT/KR2019/004560
§ 371 (c)(1),
(2) Date: Aug. 22, 2019

(87) PCT Pub. No.: WO2019/203529
PCT Pub. Date: Oct. 24, 2019

(65) Prior Publication Data
US 2020/0272056 A1 Aug. 27, 2020

(30) Foreign Application Priority Data

Apr. 17, 2018 (KR) ........................ 10-2018-0044429

(51) Int. Cl.
| C11D 7/32 | (2006.01) |
| G03F 7/42 | (2006.01) |
| C11D 7/34 | (2006.01) |
| C11D 7/50 | (2006.01) |

(52) U.S. Cl.
CPC ............ *G03F 7/425* (2013.01); *C11D 7/3218* (2013.01); *C11D 7/34* (2013.01); *C11D 7/50* (2013.01)

(58) Field of Classification Search
CPC .................................................. C11D 11/0047
USPC ........................................................ 510/175
See application file for complete search history.

(56) References Cited

U.S. PATENT DOCUMENTS

| 5,795,702 A | 8/1998 | Tanabe et al. |
| 6,225,034 B1 | 5/2001 | Tanabe et al. |
| 6,291,142 B1 | 9/2001 | Tanabe et al. |
| 7,384,900 B2 | 6/2008 | Jo et al. |

(Continued)

FOREIGN PATENT DOCUMENTS

| EP | 2281867 A1 | 2/2011 |
| JP | 2001005201 A | 1/2001 |

(Continued)

OTHER PUBLICATIONS

Korean Intellectual Property Office, International Search Report with Written Opinion issued in PCT/KR2019/004560, dated Jul. 22, 2019, 8 pages, Korean Intellectual Property Office, Daejeon, Republic of Korea.

(Continued)

*Primary Examiner* — Gregory E Webb
(74) *Attorney, Agent, or Firm* — Marshall & Melhorn, LLC

(57) ABSTRACT

The present invention relates to a peeling solution composition for dry film resist, which is usable for manufacturing a PCB for forming a microcircuit, and particularly is applicable for a process of manufacturing a flexible multi-layer PCB.

1 Claim, 4 Drawing Sheets

BEFORE TREATMENT WITH PEELING SOLUTION

AFTER TREATMENT WITH PEELING SOLUTION

(56) References Cited

U.S. PATENT DOCUMENTS

| | | |
|---|---|---|
| 7,968,507 B2 | 6/2011 | Lee et al. |
| 8,110,535 B2 | 2/2012 | Egbe |
| 8,163,095 B2 | 4/2012 | Lee et al. |
| 8,206,509 B2 | 6/2012 | Eto et al. |
| 2003/0166482 A1 | 9/2003 | Choi et al. |
| 2014/0100151 A1* | 4/2014 | Egbe .................. C11D 7/34 510/176 |
| 2016/0152930 A1 | 6/2016 | Egbe et al. |
| 2016/0376532 A1* | 12/2016 | Heo .................. C11D 3/32 510/175 |

FOREIGN PATENT DOCUMENTS

| | | | |
|---|---|---|---|
| JP | 2005070795 A | 3/2005 | |
| JP | 2010121148 A | 6/2010 | |
| JP | 2011118101 A | 6/2011 | |
| JP | 2014063186 A | 4/2014 | |
| JP | 2014078009 A | 5/2014 | |
| JP | 2014157339 A | 8/2014 | |
| JP | 2015014791 A | 1/2015 | |
| JP | 2015018957 A | 1/2015 | |
| KR | 0173090 B1 | 3/1999 | |
| KR | 10-0364885 B1 | 5/2003 | |
| KR | 10-0518714 B1 | 10/2005 | |
| KR | 10-20110049066 A | 5/2011 | |
| KR | 20140045275 A | 4/2014 | |
| KR | 10-1420571 B1 | 7/2014 | |
| KR | 10-1567407 B1 | 11/2015 | |
| KR | 20170123050 A | 11/2017 | |
| KR | 10-20170097256 A | 8/2019 | |
| WO | WO/2015056428 A1 | 4/2015 | |
| WO | WO/2017195453 A1 | 11/2017 | |

OTHER PUBLICATIONS

KIPO, Korean Office Action issued in corresponding Korean Application 10-2018-0044429, dated May 11, 2020, 5 pages, Seoul, Korea.

Japanese Patent Office, Office Action—Notice of Rejection issued in corresponding Japanese Application 2019-545939, dated Oct. 27, 2020, 2 pages, Japan.

European Patent Office, EPO Extended Search Report, issued in corresponding European Application 19752067.9, dated Nov. 20, 2020, 10 pages, Munich, Germany.

* cited by examiner

[Fig. 1A]
BEFORE TREATMENT WITH
PEELING SOLUTION
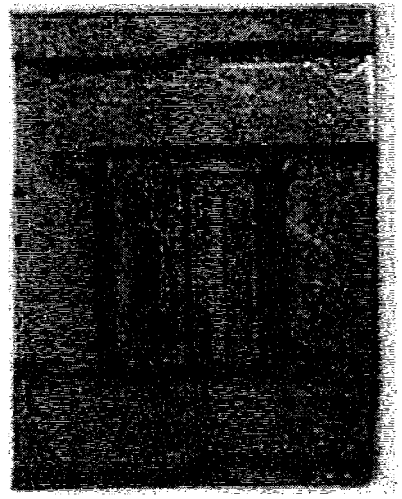
[Fig. 1B]
AFTER TREATMENT WITH
PEELING SOLUTION
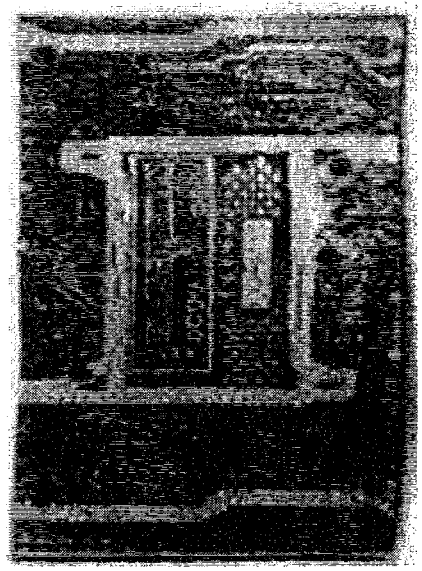

[Fig. 2A]
BEFORE TREATMENT
WITH PEELING SOLUTION
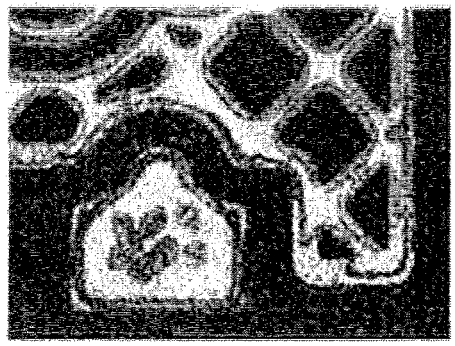
[Fig. 2B]
EXAMPLE 1
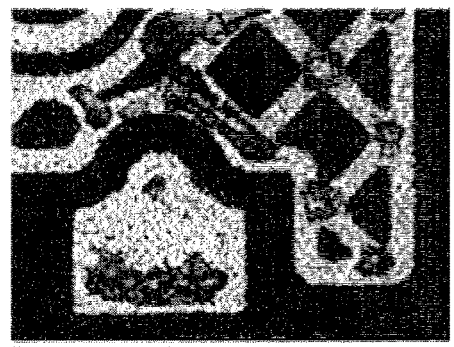
[Fig. 2C]
EXAMPLE 3
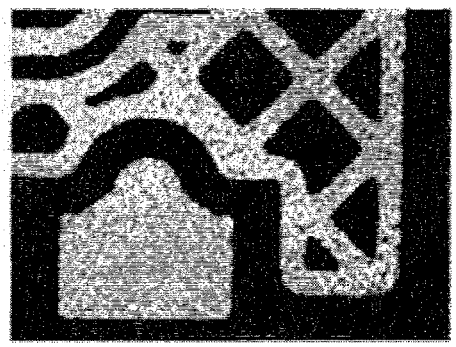

[Fig. 3A]
BEFORE TREATMENT
WITH PEELING SOLUTION
[Fig. 3B]
EXAMPLE 4
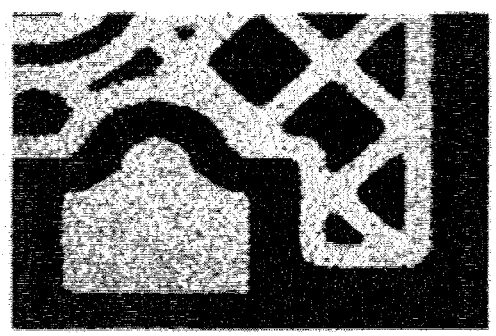
[Fig. 3C]
Comparative Example 1
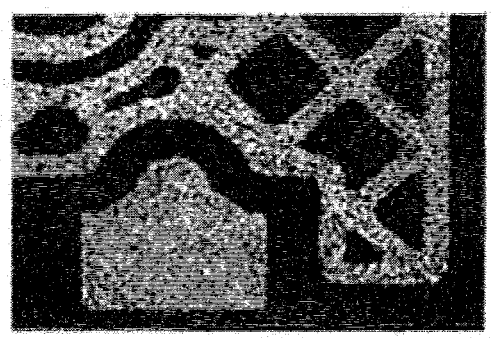

[Fig. 3D]
BEFORE TREATMENT
WITH PEELING SOLUTION
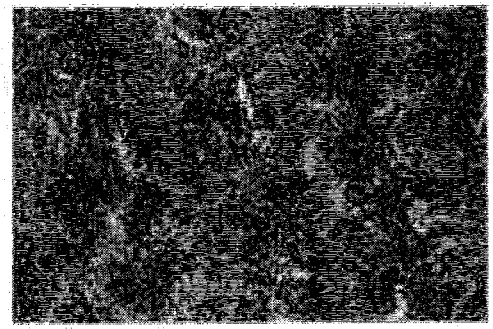
[Fig. 3E]
EXAMPLE 4
[Fig. 3F]
Comparative Example 1
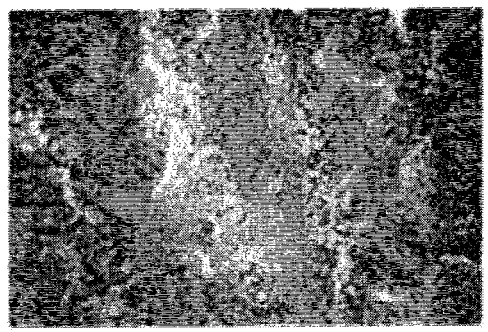

PEELING SOLUTION COMPOSITION FOR DRY FILM RESIST

TECHNICAL FIELD

The present invention relates to a peeling solution composition for dry film resist, and more specifically, to a peeling solution composition for dry film resist, which is applicable for manufacturing a printed circuit board (PCB) for forming a microcircuit, and particularly is applicable for a process of manufacturing a flexible multi-layer PCB.

BACKGROUND ART

Recently, in accordance with the thinning, lightening, and miniaturization of electronic devices, higher density wirings have been required to be formed on printed circuit boards (PCBs), and thus, the PCBs have been developed from single-sided PCBs to double-sided or multi-layer PCBs, i.e., to PCBs on which microcircuits are implemented. In particular, a flexible printed circuit board (FPCB), which is implemented as a wiring board which is thin enough to be foldable, has been used in many electronic devices, and thus the demand for the FPCB has been gradually expanding recently.

On the other hand, a method of forming a circuit pattern of a PCB is generally classified into an additive process, a subtractive process, a semi-additive process (SAP), and a modified semi-custom process (MSAP). In general, the subtractive process of etching and removing unnecessary portions is mainly used. However, the subtractive process has an advantage in that circuit processing is simple but has a limitation in fine processing. Therefore, the SAP is advantageous for microcircuit processing. In addition, it is a recent trend that the MSAP using a laser beam is used to manufacture a double-sided, multi-layer, and precise FPCB. However, the SAP and the MSAP have a disadvantage in that a difficulty in peeling a dry film corresponding to plating resist is high.

Typically, in the case of a PCB, a dry film is applied on a substrate, exposure and development processes are performed, and then etching is performed to form a circuit. Thereafter, the dry film is ashed from an upper portion of the substrate or a peeling solution is used to peel off and remove the dry film, and then the dry film residue is peeled off to manufacture the PCB.

However, in such a peeling process, since the peeling solution becomes a factor that necessarily comes into contact with a copper wiring and electrochemically causes corrosion, the peeling solution requires particular care (see chemical reaction formulas below).

(1) Corrosion Reaction between Amine and Copper in Aqueous Solution State

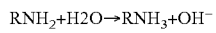

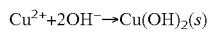

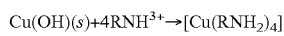

(2) Corrosion Reaction Between Amine and Copper in Organic Solution State

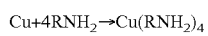

Various dry film peeling solutions have been conventionally proposed so as to peel a dry film or a dry film residue off of a substrate.

Korean Patent Registration No. 10-0364885 discloses a peeling solution composition for photoresist, which includes at least one selected from hydroxylamines, ultrapure water, monoethanolamine, and diethanolamine, dimethylsulfoxide, and an aromatic hydroxyl compound, and a method of peeling photoresist off using the same.

In addition, Korean Registration No. 10-173090 discloses a peeling solution composition for photoresist, which includes hydroxylamines, ultrapure water, amines having an acid dissociation constant (PKa) of 7.5 to 13, a water-soluble organic solvent, and an anticorrosive agent, and a method of peeling photoresist off using the same.

As described above, conventionally, a composition using hydroxides and alkali metal amines has been used as a peeling solution composition for removing a dry film. However, there are problems such as corrosion of a metal pattern due to improvement in a peeling property, discoloration due to the corrosion, and lower erosion. In particular, hydroxylamines are compositions having problems of toxicity and environmental pollution, which require improvement in terms of safety of an operator and an environment. There is a need for a composition capable of solving the toxicity and the environmental pollution.

Accordingly, in order to solve the conventional problems of a peeling solution for photoresist or a peeling solution composition for, dry film resist, the present inventors have developed a peeling solution composition for dry film resist, which has a high peeling property and is capable of minimizing corrosion of a copper wiring, improving operation stability, and solving a problem of environmental pollution.

DISCLOSURE

Technical Problem

The present invention is directed to providing a peeling solution composition for dry film resist, which has a high peeling property and concurrently minimizes corrosion of a copper (Cu) wiring as compared with a conventional peeling solution.

Technical Solution

The present invention provided the present invention provides a peeling solution composition for dry film resist including eco-friendly amines replacing conventional hydroxylamines and a sulfur-containing azole compound as a corrosion inhibitor.

Specifically, according to an embodiment of the present invention, provided is peeling solution composition for dry film resist including 10 wt % to 30 wt % of an aqueous solution of a quaternary ammonium salt selected from the group consisting of tetramethylammonium hydroxide (TMAH), tetramethylammonium pentafluoroxenate (TMAPF), and a mixture thereof; 30 wt % to 60% of an alkanolamine-based compound; 10 wt % to 30 wt % of a protic polar organic solvent; and 0.1 wt % to 5 wt % of a sulfur-containing azole-based compound.

Advantageous Effects

A peeling solution composition for dry film resist of the present invention can have high polymer removal performance capable of peeling a dry film off within several minutes even at relatively low process conditions of about 50° C. and concurrently can effectively prevent corrosion of a copper wiring as compared with a conventional peeling solution.

In addition, a peeling solution composition for dry film resist of the present invention can be diluted with ultrapure water and be used according to the requirements of a process environment and a film curing condition, thereby reducing process costs and improving safety of an operator and environments.

DESCRIPTION OF DRAWINGS

FIG. 1 shows real images of a flexible printed circuit board (FPCB) substrate before and after peeling is performed on a dry film applied on the FPCB substrate, FIG. 1A shows the real image of the substrate on which the dry film is applied, and FIG. 1B shows the real image of the substrate after the dry film is peeled off using a peeling solution composition prepared in Example.

FIG. 2 shows optical microscope or scanning electron microscope images of an FPCB substrate before and after peeling is performed on a dry film applied on the FPCB substrate, FIG. 2A shows the image of the substrate on which the dry film is applied, FIG. 2B shows the image of the substrate after the dry film is peeled off using a peeling solution composition prepared in Example 1, and FIG. 2C shows the image of the substrate after the dry film is peeled off using a peeling solution composition prepared in Example 3.

FIG. 3 shows optical microscope or scanning electron microscope images of FPCB substrates before and after peeling is performed on a dry film applied on the FPCB substrates, FIGS. 3A and 3D show the images of the substrates on which the dry film is applied, FIGS. 3B and E show the images of the substrates after the dry film is peeled off using a peeling solution composition prepared in Example 4, and FIGS. 3C and 3F show the images of the substrates after the dry film is peeled off using a peeling solution composition prepared in Comparative Example 1.

BEST MODE OF THE INVENTION

Hereinafter, the present invention will be described in detail.

According to an embodiment of the present invention, provided is a peeling solution composition for dry film resist including 10 wt % to 30 wt % of an aqueous solution of a quaternary ammonium salt selected from the group consisting of tetramethylammonium hydroxide (TMAH), tetramethylammonium pentafluoroxenate (TMAPF), and a mixture thereof, 30 wt % to 60% of an alkanolamine-based compound, 10 wt % to 30 wt % of a protic polar organic solvent, and 0.1 wt % to 5 wt % of a sulfur-containing azole-based compound.

In the composition according to the present invention, the quaternary ammonium salt may be diluted with a solid component or ultrapure water to be used. Any quaternary ammonium salt may be used as long as the quaternary ammonium salt exhibits alkalinity. However, in order to satisfy both a high peeling property and corrosion prevention effect, the quaternary ammonium salt may be selected from the group consisting of the TMAH, the TMAPF, and the mixture thereof. The aqueous solution of the quaternary ammonium salt may be included in an amount of 10 wt % to 30 wt % in the composition. When the quaternary ammonium salt solution is included in an amount less than 10 wt %, it is difficult to secure a sufficient peeling property with respect to a dry film. When the quaternary ammonium salt solution is included in an amount exceeding 50 wt %, it is difficult to expect an effect of an increase in peeling property with respect to added weight, and rather, it is possible to accelerate corrosion of various metal layers.

In the composition according to the present invention, the alkanolamine-based compound improves action of the aqueous solution of the quaternary ammonium salt and accelerates permeation into a polymer in the dry film and swelling and assists in peeling off the film. In the present invention, specifically, the alkanolamine-based compound may include at least one selected from the group consisting of monoisopropanolamine (MIPA), 2-amino-2-methyl-1-propanolamine (AMPA), 2-aminoethoxy ethanolamine (AEEA), triethanolamine (TEA), monoethanolamine (MEA), and diethanolamine (DEA). The alkanolamine-based compound may be included in an amount of 30 wt % to 60 wt % in the composition. When the alkanolamine-based compound is included in an amount less than 30 wt %, a peeling rate of the dry film may be decreased. When the alkanolamine-based compound is included in an amount exceeding 60 wt %, the permeation into the polymer and the swelling effect may not be sufficiently achieved.

In the composition according to the present invention, the protic polar organic solvent may effectively assist in peeling off photoresist by mixing one or more protic glycols. The glycols serve to spread dissolved photoresist well to a peeling agent and assist in rapidly removing the dissolved photoresist. In the present invention, specifically, the protic polar organic solvent may include at least one selected from the group consisting of ethylene glycol (EG), propylene glycol (PG), diethylene glycol monoethyl ether (EDG), diethylene glycol monobutyl ether (BDG), diethylene glycol monomethyl ether (MDG), ethylene glycol monoethyl ether (EEG), propylene glycol monobutyl ether (PGMBE), iripropylene glycol monoethyl ether (TPGMEE), and triethylene glycol monobutyl ether (TEGMBE).

In the composition according to the present invention, the sulfur-containing azole-based compound has a relatively stable ability to inhibit corrosion and peel the dry film resist off and is used as a corrosion inhibitor in the present invention. Specifically, the sulfur-containing azole-based compound may include at least one selected from the group consisting of mercaptobenzimidazole (MBI), mercaptobenzothiadiazole (MBT), mercaptobenzimidazole, mercaptobenzoxazole (MBO), mercaptomethylimidazole (MMI), 4-methylimidazole (4-MI), and 2,5-dimercapto-1,3,4-thiadiazole. The sulfur-containing azole-based compound may be included in an amount of 0.1 wt % to 5 wt % in the composition. When the sulfur-containing azole-based compound is included in an amount less than 0.1 wt %, a corrosion inhibiting effect on a metal wiring film is hardly exhibited. When the sulfur-containing azole-based compound is included in an amount exceeding 0.5 wt %, an ability to peel the dry film resist off is lowered.

According to the embodiment of the present invention, provided is the peeling solution composition for dry film resist including 10 wt % to 30 wt % of TMAH, 30 wt % to 60% of MIPA or AEEA, 10 wt % to 30 wt % of BDG, and 0.1 wt % to 5 wt % of MBI or MBO.

In addition, the composition of the present invention may be mixed and diluted with ultrapure water in a weight ratio of 1:2 to 1:50 to be used. Degrees of peeling and corrosion may be controlled according to a dilution factor. According to the embodiment of the present invention, as the dilution factor of the composition is increased, the peeling property of the dry film is decreased. On the contrary, as the dilution factor is decreased, the peeling property is increased, and it is disadvantageous in terms of corrosion control.

MODES OF THE INVENTION

Hereinafter, the present invention will be described in more detail through Examples. It will be obvious to a person having ordinary skill in the art that the Examples are illustrative purposes only and are not to be construed to limit the scope of the present invention.

Examples 1 to 10: Preparation of Peeling Solution Composition for Dry Film Resist Peeling solution compositions for dry film resist of Examples 1 to 10, which include an aqueous solution of TMAH as a solution of a quaternary ammonium salt, an alkanolamine-based compound, a protic glycol, and a sulfur-containing azole-based compound, were prepared. A composition and a content of each composition are summarized in Table 1 below.

Comparative Examples 1 to 4

Peeling solution compositions for dry film resist of Comparative Examples 1 to 4, which include an aqueous solution of tetramethylammonium chloride as an aqueous solution of a quaternary ammonium salt, an alkanolamine-based compound, protic glycol, and a sulfur-containing azole-based compound, were prepared. A content of each composition was similar to that of the above embodiment, but a component of the alkanolamine-based compound or the protic glycol was differently mixed. A composition and a content of each composition are summarized in Table 1 below.

TABLE 1

| | component | | | | content (unit: wt %) | | | | |
|---|---|---|---|---|---|---|---|---|---|
| specification | ammonium salt | alkanolamine | protic glycol | sulfur-based azole compound | ammonium salt | alkanolamine | protic glycol | sulfur-based azole compound | DI dilution factor |
| Example 1 | TMAH | AEEA | BDG | MBI | 30 | 50 | 19 | 1.0 | — |
| Example 2 | TMAH | MIPA | BDG | MBO | 30 | 50 | 19 | 1.0 | — |
| Example 3 | TMAH | DEA | EDG | BMI | 30 | 50 | 19 | 1.0 | — |
| Example 4 | TMAH | DEA | EDG | MBO | 30 | 50 | 19 | 1.0 | — |
| Example 5 | TMAH | DEA | PGMBE | MBO | 20 | 60 | 34 | 1.0 | — |
| Example 6 | TMAH | DEA | BDG | MBO | 20 | 60 | 34 | 1.0 | — |
| Example 7 | TMAH | MIPA | BDG | MBO | 30 | 50 | 19 | 1.0 | two times |
| Example 8 | TMAH | MIPA | BDG | MBO | 30 | 50 | 19 | 1.0 | ten times |
| Example 9 | TMAH | MEPA | BDG | MBO | 30 | 50 | 19 | 1.0 | twenty times |
| Example 10 | TMAH | MIPA | BDG | MBO | 30 | 50 | 19 | 1.0 | thirty times |
| Comparative Example 1 | TMACl | MEA | EDG | MBO | 30 | 50 | 19 | 1.0 | — |
| Comparative Example 2 | TMACl | MEA | EG | 4-MI | 30 | 50 | 19 | 1.0 | — |
| Comparative Example 3 | TMACl | AEE | PG | MBI | 20 | 60 | 34 | 1.0 | — |
| Comparative Example 4 | TMACl | MIPA | PG | MBI | 20 | 60 | 34 | 1.0 | — |

TMAH: tetramethylammonium hydroxide

TMACl: tetramethylammonium chloride

AEEA: 2-aminoethoxy-ethanol amine

MIPA: monoisopropanol amine

DEA: diethanol amine

MEA: monoethanol amine

BDG: diethylene glycol monobutyl ether

EDG: diethylene glycol monoethyl ether

PGMBE: propylene glycol monobuthyl ether

EG: etylene glycol

PG: propylene glycol

MBI: mercaptobenzimidazole

MBO: mercaptobezoxazole

4-MI: 4-methyl imidazole

Experimental Example 1: Evaluation of Peeling Property

In order to evaluate a peeling property with respect to a dry film of the peeling liquid compositions prepared in Examples, after etching and developing processes of forming a pattern, a specimen, in which a dry film is applied on an copper wiring upper film in a flexible printed circuit board (FPCB) substrate on which wirings are formed, was manufactured and was immersed in a peeling solution composition.

Specifically, 1 L of the peeling solution was introduced into a beaker and heated to a temperature of 50° C. while being stirred at 100 rpm using a magnetic bar. The specimen coated with the dry film (having a thickness of about 10 μm) was immersed in the heated peeling solution composition for 300 seconds to peel the dry film off. Next, the specimen was taken out, washed with ultrapure water and dried, and then, whether the dry film remained was analyzed.

In order to determine whether the copper wiring was corroded, whether the specimen was discolored was checked with the naked eye, the presence or absence of corrosion was thoroughly analyzed using an optical microscope and a scanning electron microscope, and results of the analysis were shown in Table 2 and FIGS. 2 to 3,

TABLE 2

| specification | Example 1 | Example 2 | Example 3 | Example 4 | Example 5 | Example 6 | Example 7 | Example 8 |
|---|---|---|---|---|---|---|---|---|
| Peeling property | ○ | ○ | Δ | Δ | Δ | Δ | ○ | ○ |
| corrosion | ○ | Δ | ○ | ○ | ○ | ○ | Δ | Δ |

| specification | Example 9 | Example 10 | Comparative Example 1 | Comparative Example 2 | Comparative Example 3 | Comparative Example 4 |
|---|---|---|---|---|---|---|
| Peeling property | ○ | Δ | ○ | ○ | ○ | ○ |
| corrosion | ○ | ○ | X | X | X | X |

[Determination Standard of Peeling Property of Dry Film]
Measurements with Naked Eye and Optical Microscope
○: dry film is completely peeled off of PCB substrate.
Δ: dry film remains on PCB substrate.
X: dry film is not clearly removed on PCB board.
[Determination Standard of Corrosion of Copper Wiring]
Measurements with Naked Eye and Optical Microscope
○: there is no corrosion phenomenon of copper wiring.
Δ: discoloration of copper wiring is observed.
X: corrosion of copper wiring is clearly observed.

As shown in Table 1, it can be confirmed that the compositions prepared in Example 1 and Example 9 of the present invention have the best characteristics due to a high peeling property and minimized corrosion of a copper wiring.

On the other hand, when peeling is performed using the compositions produced in Comparative Examples 1 to 4, corrosion and erosion phenomena of the copper wiring of the specimen are exhibited. It is determined from the results that it is difficult to control corrosion of the copper wiring due to a tetramethylammonium chloride salt by alkanolamine having a high peeling property.

Meanwhile, when peeling is performed using the compositions prepared in Examples 7 to 10, compositions having a high dilution factor have a low peeling property with respect to of a dry film but are advantageous in terms of corrosion control. On the contrary, it can be observed that compositions having a low dilution factor exhibit a high peeling property with respect to a dry film but are disadvantageous in terms of corrosion control.

In addition, FIGS. 2 to 3 show optical microscope or scanning electron microscope images of a specimen after peeling is performed on a specimen using compositions in order to evaluate a degree of a peeling property of the compositions prepared according to Examples of the present invention.

Referring to FIG. 2, in comparison between peeling properties of peeling solution compositions, it could be seen that, when peeling was performed using the composition prepared in Example 1, a dry film was more clearly removed as compared with Example 3.

In addition, referring to FIG. 3, in comparison between degrees of corrosion due to peeling solution compositions, it could be seen that, when peeling was using the compositions prepared in Example 4 and Comparative Example 1, an overall dry film was removed well when viewed on optical microscope images. However, when peeling was performed using the composition prepared in Comparative Example 1, discoloration and surface roughness of a copper wiring portion were increased when viewed on scanning electron microscope images, and thus, it could be confirmed that corrosion further progressed.

The results may be attributed to a difference between components of the alkanolamine-based compounds in the peeling solution compositions prepared in Examples of the present invention and Comparative Examples and may be interpreted as results of an influence of a polymer reactivity difference between secondary amine and primary amine. Due to high reactivity of amine, the composition prepared in Comparative Example 1 has a high peeling property with respect to a dry film but also has high causticity and thus is inappropriate as a peeling solution composition which has a high peeling property and is capable of controlling corrosion proposed in the present invention. On the other hand, since reactivity of amine is relatively stable, the composition prepared in Example 1 has a high peeling property and a high corrosion preventing effect.

While exemplary embodiments of the present invention have been particularly shown and described, it will be understood by those of ordinary skill in the art that various changes in form and details may be made therein without departing from the spirit and scope of the present invention as defined by the following claims.

INDUSTRIAL APPLICABILITY

The present invention relates to a peeling solution composition for dry film resist and provides a peeling solution composition for dry film resist, which is usable for manufacturing a PCB for forming a microcircuit, and particularly is applicable for a process of manufacturing a flexible multi-layer PCB.

The invention claimed is:

1. A peeling solution composition for dry film resist, consisting of:

20 wt % to 30 wt % of an aqueous solution of a quaternary ammonium salt selected from the group consisting of tetramethylammonium hydroxide (TMAH), tetramethylammonium pentafluoroxenate (TMAPF), and a mixture thereof;

30 wt % to 60 wt % of an alkanolamine-based compound;

10 wt % to 30 wt % of a protic polar organic solvent; and 0.1 wt % to 5 wt % of a sulfur-containing azole-based compound, wherein the alkanolamine-based compound includes at least one selected from the group consisting of monoisopropanolamine (MIPA), 2-aminoethoxy ethanolamine (AEEA), and diethanolamine (DEA), wherein the protic polar organic solvent includes at least one selected from the group consisting of ethylene glycol (EG), propylene glycol (PG), diethylene glycol monoethyl ether (EDG), diethylene glycol monobutyl ether (BDG), diethylene glycol monomethyl ether (MDG), ethylene glycol monoethyl ether (EEG), propylene glycol monobutyl ether (PGMBE), tripropylene glycol monoethyl ether (TPGMEE), and triethylene glycol monobutyl ether (TEGMBE), wherein the sulfur-containing azole-based compound includes at least one selected from the group consisting of mercaptobenzimidazole (MBI), mercaptobenzothiadiazole (MBT), mercaptobenzoxazole (MBO), mercaptomethylimidazole (MMI), and 2,5-dimercapto-1,3,4-thiadiazole.

* * * * *